(12) United States Patent
Jeong

(10) Patent No.: US 7,577,047 B2
(45) Date of Patent: Aug. 18, 2009

(54) SEMICONDUCTOR MEMORY DEVICE

(75) Inventor: In-Chul Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 34 days.

(21) Appl. No.: 11/895,250

(22) Filed: Aug. 23, 2007

(65) Prior Publication Data
US 2008/0056033 A1  Mar. 6, 2008

(30) Foreign Application Priority Data
Sep. 5, 2006 (KR) .................. 10-2006-0085236

(51) Int. Cl.
*G11C 11/34* (2006.01)
(52) U.S. Cl. .................. 365/194; 365/189.05
(58) Field of Classification Search ......... 365/194, 365/189.05
See application file for complete search history.

(56) References Cited

U.S. PATENT DOCUMENTS

| | | | |
|---|---|---|---|
| 5,457,661 A | | 10/1995 | Tomita et al. |
| 6,166,973 A | | 12/2000 | Shinozaki |
| 6,507,532 B1 | * | 1/2003 | Fujino et al. ........... 365/230.03 |
| 6,611,470 B2 | * | 8/2003 | Hidaka ..................... 365/222 |
| 7,254,069 B2 | * | 8/2007 | Haraguchi et al. .......... 365/200 |
| 7,278,044 B2 | * | 10/2007 | Song .......................... 713/400 |
| 2002/0041533 A1 | * | 4/2002 | Toda ........................ 365/225.7 |

FOREIGN PATENT DOCUMENTS

| | | |
|---|---|---|
| JP | 07141869 | 6/1995 |
| JP | 2000048590 | 2/2000 |
| JP | 2002-74961 | 3/2002 |
| KR | 1020000043183 A | 7/2000 |
| KR | 1020010005007 A | 1/2001 |
| KR | 1020030078134 A | 10/2003 |
| KR | 1020050011942 A | 1/2005 |
| KR | 10-0489352 | 5/2005 |
| KR | 10-2005-0060844 | 6/2005 |

* cited by examiner

*Primary Examiner*—Michael T Tran
(74) *Attorney, Agent, or Firm*—Mills & Onello, LLP (57) ABSTRACT

A semiconductor memory device includes a delay time selecting portion for outputting, as a final read/write command, an internal read/write command that corresponds to an external read/write command and is synchronized with an external clock rising edge at a tRCD time without any delay when an address is applied before an address setup time based on the external clock rising edge of a previously set tRCD time, a decoder for decoding an address applied from an external portion with the read/write command to output a decoded address, and a selecting portion for receiving the decoded address to select a memory cell of a memory cell array in response to the final read/write command.

7 Claims, 8 Drawing Sheets

SEMICONDUCTOR MEMORY DEVICE

CROSS-REFERENCE TO RELATED APPLICATION

This application claims the benefit of Korean Patent Application No. 10-2006-0085236, filed Sep. 5, 2006, the disclosure of which is hereby incorporated herein by reference in its entirety.

BACKGROUND OF THE INVENTION

1. Field of the Invention

The present invention relates to a semiconductor memory device and, more particularly, to a semiconductor memory device with a reduced asynchronous access time (tAA).

2. Description of the Related Art

As a semiconductor device has various functions, cases where a memory device is built in a semiconductor device are being increased, and as data to be processed by the semiconductor device are increased, the memory capacity is also being increased. With an increment of the memory capacity, a redundancy memory cell for replacing a defective memory cell is increasingly used.

A repairing task of a semiconductor memory device using the redundancy memory cell is performed such that a redundancy row and a redundancy column are formed in advance per a certain memory cell array, and a row or column having a defective memory cell is replaced with the redundancy row or the redundancy column. For example, if a defective memory cell is found by a test after a wafer processing, a program operation for replacing a corresponding address with an address of a redundancy memory cell is performed in an internal circuit. Thus, if an address signal corresponding to a defective line is inputted when the semiconductor device operates, a redundancy line instead of the defective line is accessed.

The typical repairing task uses fuses. As such a repairing technique, there is a technique for replacing a row or column having the defective memory cell with a redundancy row or redundancy column, such as a technique of installing the fuses in an internal circuit for repairing task, and then applying an over current to the fuse located on the line connected to a row or column having the defective memory cell so as to blow out the fuse, a technique of blowing out the fuse by a laser beam, a technique of connecting junction portions by a laser beam, and a programming technique using an EPROM.

Typically, the semiconductor memory device decodes an address applied from an external portion to select a corresponding memory cell for data input or output. The semiconductor memory device having the redundancy memory cell determines whether to use the redundancy memory cell before selecting the corresponding memory cell.

When a read or write command and a memory cell address are applied, an internal read or write command generated in the semiconductor memory device in response to the read or write command needs to be delayed during a time for decoding the address and determining whether to use the redundancy memory cell.

As representative semiconductor memory devices, there are a dynamic random access memory (DRAM) and a flash memory. Hereinafter, as an example of the semiconductor memory device, the DRAM is exemplarily explained.

Among DRAMs, a double data rate (DDR) memory device uses an additive latency concept. The additive latency is proposed in a DDR2 standard, and is referred to as the number of clocks to tRCD (RAS to CAS delay) from the time that a read/write command is inputted after an active state of a memory device. The tRCD is an amount of time until a time that a column address strobe (CAS) signal is inputted after a row address strobe signal (RAS) is inputted. The memory device becomes in an active state at a time that the RAS signal is inputted, and then the read/write command is inputted before a time that the CAS signal is inputted. At this time, a time when the CAS signal is inputted and the read/write command is executed from a moment that the read/write command is inputted is the additive latency.

For the read/write operation, the semiconductor memory device receives the read/write command and delays it during as a long time as the additive latency (AL), and then generates and outputs the internal read/write command. The synchronous memory device receives an active command, the read/write command, a pre-charge command for data access, and the additive latency is the amount of time that the read/write command is received faster than designated timing.

For example, if it is assumed that the additive latency is 2 (i.e., AL=2 clock cycles), when two clock cycles lapse after the read command is inputted to the memory device, the memory device performs an operation for generating an internal read command for the inputted read command. A synchronous memory device having no additive latency receives the read/write command to perform a corresponding data access operation when a time corresponding to tRCD lapses after the active command is inputted. However, a synchronous memory device having the additive latency receives the read/write command before a time of the additive latency, even though a time corresponding to tRCD has not lapsed after the active command is inputted.

Figure 1:
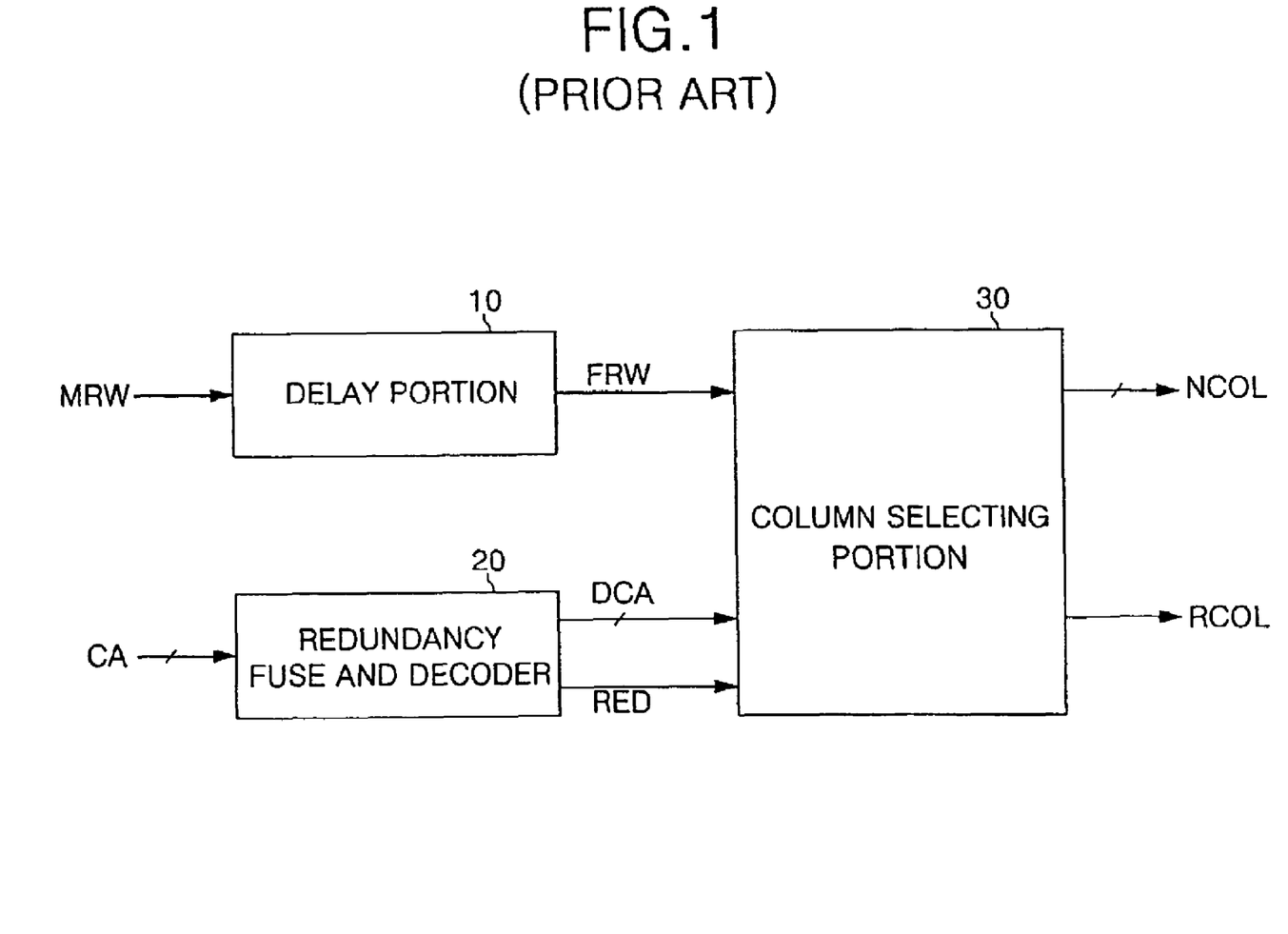
FIG. 1 is a block diagram illustrating an address decoder of a prior art semiconductor memory device.

FIG. 1 is a block diagram illustrating an address decoder of a conventional semiconductor memory device.

As described above, the defective memory cell is replaced in a row or column unit with the redundancy row or the redundancy column. Hereafter, the repairing operation is explained centering on the case where the column corresponding to the defective memory cell is replaced with the redundancy column.

If an internal read/write command MRW generated in the semiconductor memory device is applied in response to the column address CA and the read/write command, since the internal read/write command MRW should be delayed during a time when a redundancy fuse and decoder 20 decodes the column address CA and determines whether to use the redundancy memory cell, the internal read/write command MRW is delayed during a predetermined time by a delay portion 10 before being outputted as a final read/write command FRW.

The delay portion 10 can comprises even-number inverters. The delay time of the delay portion 10 for delaying the internal read/write command MRW to be outputted as the final read/write command FRW is set to be equal to a time that the redundancy fuse and decoder 20 decodes the column address and determines whether to use the redundancy memory cell.

In FIG. 1, the redundancy fuse and decoder 20 receives the column address CA to determine whether to use the redundancy column and decodes the column address CA to select a corresponding column. A state of the fuse, which is blown out or not, is determined using the repairing task described above. Thus, when the column address CA is applied, the redundancy fuse and decoder 20 outputs a redundancy selecting signal RED representing whether to use the redundancy memory cell according to the fuse state. If the redundancy memory cell is used, the redundancy fuse and decoder 20 decodes the column address CA and outputs a decoded column address DCA.

When the final read/write command FRW is applied to the column selecting portion 30, the column selecting portion 30 outputs the decoded column address DCA as a column selecting signal NCOL for selecting a normal column when it is determined that the redundancy memory cell is not used, or the column selecting portion 30 outputs a redundancy column selecting signal RCOL for selecting a redundancy column when it is determined that the redundancy memory is used, in response to the redundancy selecting signal RED outputted from the redundancy fuse and decoder 20.

Generally, a time that the delay portion 10 delays the internal read/write command MRW and outputs as the final read/write command FRW is about 0.5 ns to 1.0 ns, and this value is about 5 to 10% of the asynchronous access time tAA representing a time until data are outputted to the external portion from a time when the read/write command is applied from the external portion, resulting in a significant time loss.

In particular, in a case where the semiconductor memory device has a function such as the additive latency and the address is applied before the internal read/write command is generated, there occurs an unnecessary time loss in delaying the internal read/write command, since the process for decoding the address and determining whether to use the redundancy function is performed after the internal read/write command is generated even though the address is applied in advance. This serves to obstruct a high speed operation of the semiconductor memory device and lowers the efficiency.

SUMMARY OF THE INVENTION

In accordance with the present invention, there is provided a semiconductor memory device in which the process for decoding the address and determining whether to use the redundancy function is performed before the internal read/write command is generated, thereby reducing the asynchronous access time tAA.

Also in accordance with the present invention, there is provided a semiconductor device in which the process for decoding the address and determining whether to use the redundancy function is performed before the internal read/write command is generated, thereby reducing the asynchronous access time tAA.

In accordance with one aspect of present invention, there is provided a semiconductor memory device, comprising: a delay time selecting portion configured to output, as a final read/write command, an internal read/write command that corresponds to an external read/write command and is synchronized with an external clock rising edge at a tRCD time without substantially any delay when an address is applied before an address setup time based on an external clock rising edge of a previously set tRCD time; a decoder configured to decode an address applied from an external portion with the read/write command to output a decoded address; and a selecting portion configured to receive the decoded address to select a memory cell of a memory cell array in response to the final read/write command.

The delay time selecting portion can be configured to output the final read/write command without substantially any delay when an additive latency is not "0".

The delay time selecting portion can comprise a delay portion configured to delay the internal read/write command during a predetermined time to output a delayed read/write command; and a selecting circuit portion configured to determine whether the additive latency is larger than "0" or not to select the internal read/write command or the delayed read/write command outputted from the delay portion to be outputted as the final read/write command.

The delay portion can comprise an even number of inverters configured to delay the internal read/write command during a time for the decoding portion decoding the address.

The device can further comprise a redundancy fuse portion configured to output a redundancy selecting signal representing whether to use a redundancy memory cell in lieu of a normal memory cell when the address is applied, based on a state of a fuse being blown out or not.

The redundancy fuse portion can comprise a fuse circuit portion including the fuse; and a determining circuit portion configured to output the redundancy selecting signal in response to whether of not the fuse is blown out and the address.

The fuse circuit portion can comprise the fuse configured to determine whether to use the redundancy memory cell for a corresponding address of the address; and a latch configured to store a different value depending on a state of the fuse.

In accordance with another aspect of the present invention further, provided is a semiconductor device, comprising: a delay time selecting portion configured to output an internal read/write command as a final read/write command without substantially any delay when an external address is applied before the internal read/write command is generated by delaying an external read/write command; a decoding portion configured to for decode the address to output a decoded address; and a selecting portion configured to receive the decoded address in response to the final read/write command to select a memory cell of the memory cell array.

The semiconductor device can further comprise a redundancy fuse portion configured to output a redundancy selecting signal representing whether to use a redundancy memory cell in lieu of a normal memory cell when the address is applied, based on a state of a fuse being blown out or not.

The redundancy fuse portion can comprise: a fuse circuit portion including a fuse configured to determine whether to use the redundancy memory cell; and a determining circuit portion configured to output the redundancy selecting signal based on whether the fuse is blown out and the address.

The delay time selecting portion can comprise a delay portion configured to delay the internal read/write command during a predetermined time to output a delayed read/write command; and a selecting circuit portion configured to output as the final read/write command: the internal read/write command if the address is applied before the internal read/write command, else the delayed read/write command outputted from the delay portion.

The delay portion can comprise an even number of inverters configured to delay the internal read/write command during a time sufficient for the decoding portion to decode the address.

BRIEF DESCRIPTION OF THE DRAWINGS

The present invention will become more apparent to those of ordinary skill in the art in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF ILLUSTRATIVE EMBODIMENTS

Aspects of the present invention will now be described more fully hereinafter with reference to the accompanying drawings, in which preferred embodiments of the invention are shown. This invention can, however, be embodied in different forms and should not be construed as limited to the embodiments set forth herein. In the drawings, the thickness of layers and regions are exaggerated for clarity. Like numbers refer to like elements throughout the specification.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 2:
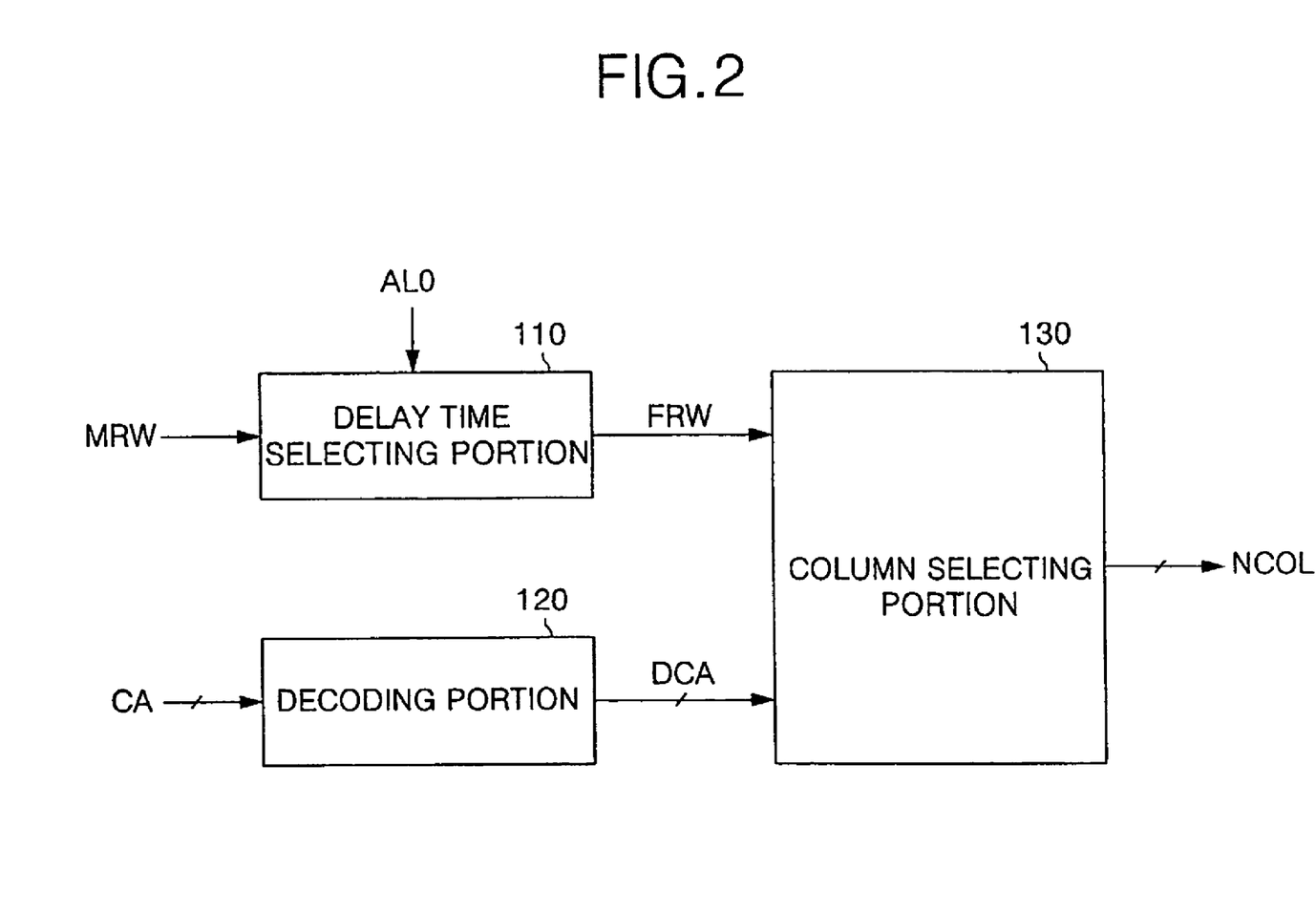
FIG. 2 is a block diagram illustrating an exemplary embodiment of an address decoder of a semiconductor memory device according to an aspect of the present invention.

FIG. 2 is a block diagram illustrating an exemplary embodiment of an address decoder of a semiconductor memory device according to an aspect of the present invention. The address decoder of FIG. 2 has a delay time selecting portion 110 instead of the delay portion 10 of FIG. 1. The delay portion 10 of FIG. 1 is configured to unconditionally delay the internal read/write command MRW during a predetermined time, but the delay time selecting portion 110 of FIG. 2 is configured to select whether to delay in response to the additive latency (AL) value. The internal read/write command MRW is delayed by the additive latency AL=0 to AL=5, which is set after the read/write command is applied from the external portion and before the internal read/write command MRW is generated. That is, the internal read/write command MRW is generated after the memory device becomes in an active state and the tRCD lapses. The additive latency AL usually has a value of AL=0 to AL=5, but since it is important to see whether the additive latency AL is "AL=0" or not, a determination of whether to delay the internal read/write command MRW or not is made by receiving the additive latency AL of "AL=0". The delay time selecting portion 110 delays the internal read/write command during a predetermined time before outputting it when the additive latency AL=0 is at a high level, and otherwise does not delay the internal read/write command MRW before outputting it.

A decoding portion 120 decodes the address applied from the external portion and outputs the decoded address. The decoding portion 120 receives the column address CA and outputs the decoded column address DCA. In a case where the additive latency AL=0 is at a high level, the column address CA is applied to the decoding portion 120 after the internal read/write command MRW is applied to the delay time selecting portion 110. However, in a case where the additive latency AL is not "AL=0", the column address CA is applied before the internal read/write command MRW, and the internal read/write command MRW is generated after the external read/write command RW is applied, and then delayed during a time corresponding to the additive latency AL=1 to AL=5.

A column selecting portion 130 receives the decoded column address DCA to output the column selecting signal NCOL for selecting a corresponding column of the memory cell array in response to the final read/write command FRW outputted from the delay time selecting portion 110. Since a time when the column selecting signal NCOL is outputted depends on an output of the final read/write command FRW, it is faster when the additive latency AL=0 is at a high level compared to when the additive latency AL=0 is a low level.

Figure 3:
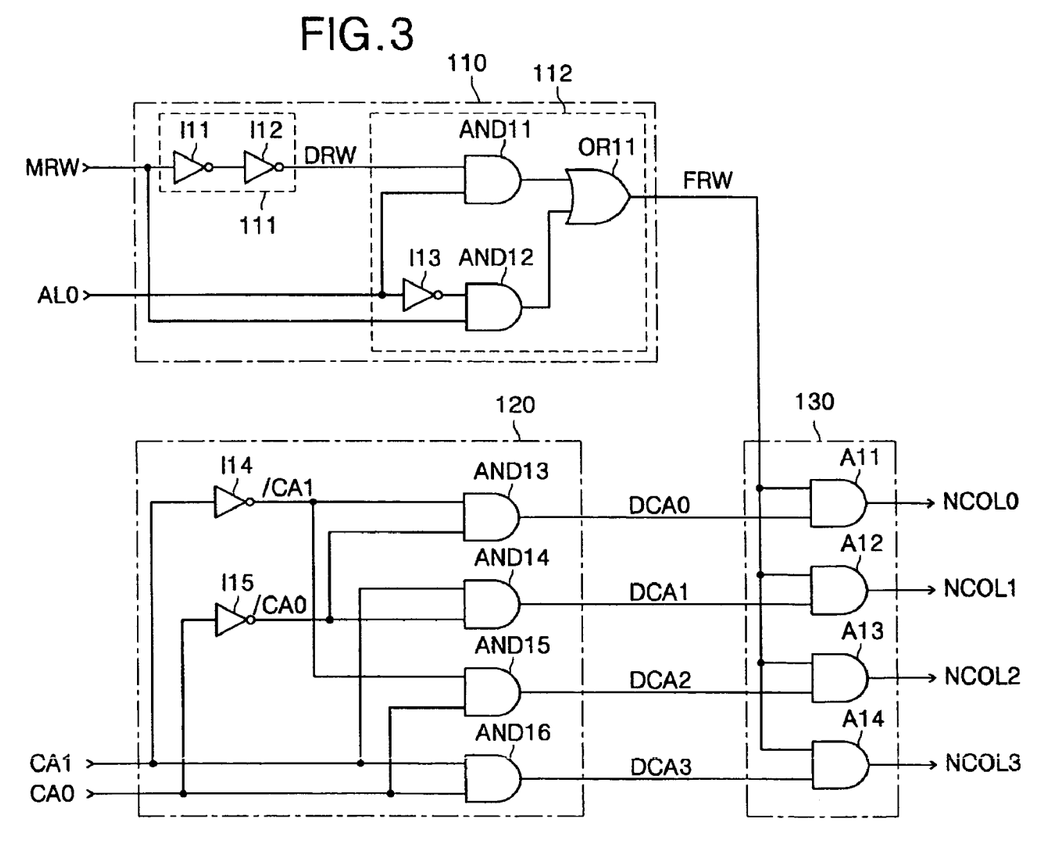
FIG. 3 is a circuit diagram illustrating an embodiment of the address decoder of FIG. 2.

FIG. 3 is a circuit diagram illustrating an embodiment of the address decoder of FIG. 2.

The delay time selecting portion 110 comprises a delay portion 111 and a selecting circuit portion 112. The delay portion 111 has a function similar to that of the delay portion 10 of FIG. 1 and comprises even-number inverters I11 and I12 for delaying the internal read/write command MRW for a predetermined time. In the delay portion 111, the internal read/write command MRW is delayed for the predetermined time, to eventually be outputted as the delayed read/write command DRW.

The selecting circuit portion 112 outputs the final read/write command FRW in response to the internal read/write command MRW, the delayed read/write command DRW, and the additive latency AL=0. The selecting circuit portion 112 comprises two AND gates AND11 and AND12, an OR gate OR11, and an inverter I13. The AND gate AND11 ANDs the delayed read/write command DRW and the additive latency AL=0, and the AND gate AND12 ANDs the additive latency AL=0 inverted by the inverter I13 and the internal read/write command MRW. The OR gate OR11 ORs the outputs of the two AND gates AND11 and AND12 to output the final read/write command FRW. Thus, the selecting circuit portion 112 outputs the final read/write command FRW in response to the delayed read/write command DRW if the additive latency AL=0 is at a high level and outputs the final read/write command FRW in response to the internal read/write command MRW if the additive latency AL=0 is at a low level. Thus, the final read/write command FRW when the additive latency AL=0 is at a low level is outputted faster than that of when the additive latency AL=0 is at a high level.

The decoding portion 120 is a decoder that receives the column address CA to select a corresponding column of the memory cell array, and FIG. 3 shows a circuit of the decoding portion 120 which receives and decodes the 2-bit column address CA0 and CA1. The decoding portion 120 comprises four AND gates AND13 to AND16 and two inverters I14 and I15. The two inverters I14 and I15 invert the column addresses CA0 and CA1, and the AND gates AND13 to AND16 receive and AND the column addresses CA0 and CA1 and the inverted column addresses /CA0 and /CA1, respectively, to output four decoded column addresses DCA0 to DCA3.

The column selecting portion 130 comprises four AND gates A11 to A14. The four AND gates A11 to A14 output the column selecting signals NCOL0 to NCOL4 for selecting corresponding columns of the memory cell array in response to the final read/write command FRW and the decoded column addresses DCA0 to DCA3, respectively. Since the final read/write command FRW when the additive latency AL=0 is at a low level is outputted faster than when the additive latency AL=0 is at a high level, the column selecting signals NCOL0 to NCOL3 are also outputted faster when the additive latency AL=0 is at a low level than when the additive latency AL=0 is at a high level. Thus, a time accessing the memory in the semiconductor memory device is reduced when the additive latency AL is AL=1 to AL=5.

Figure 4:
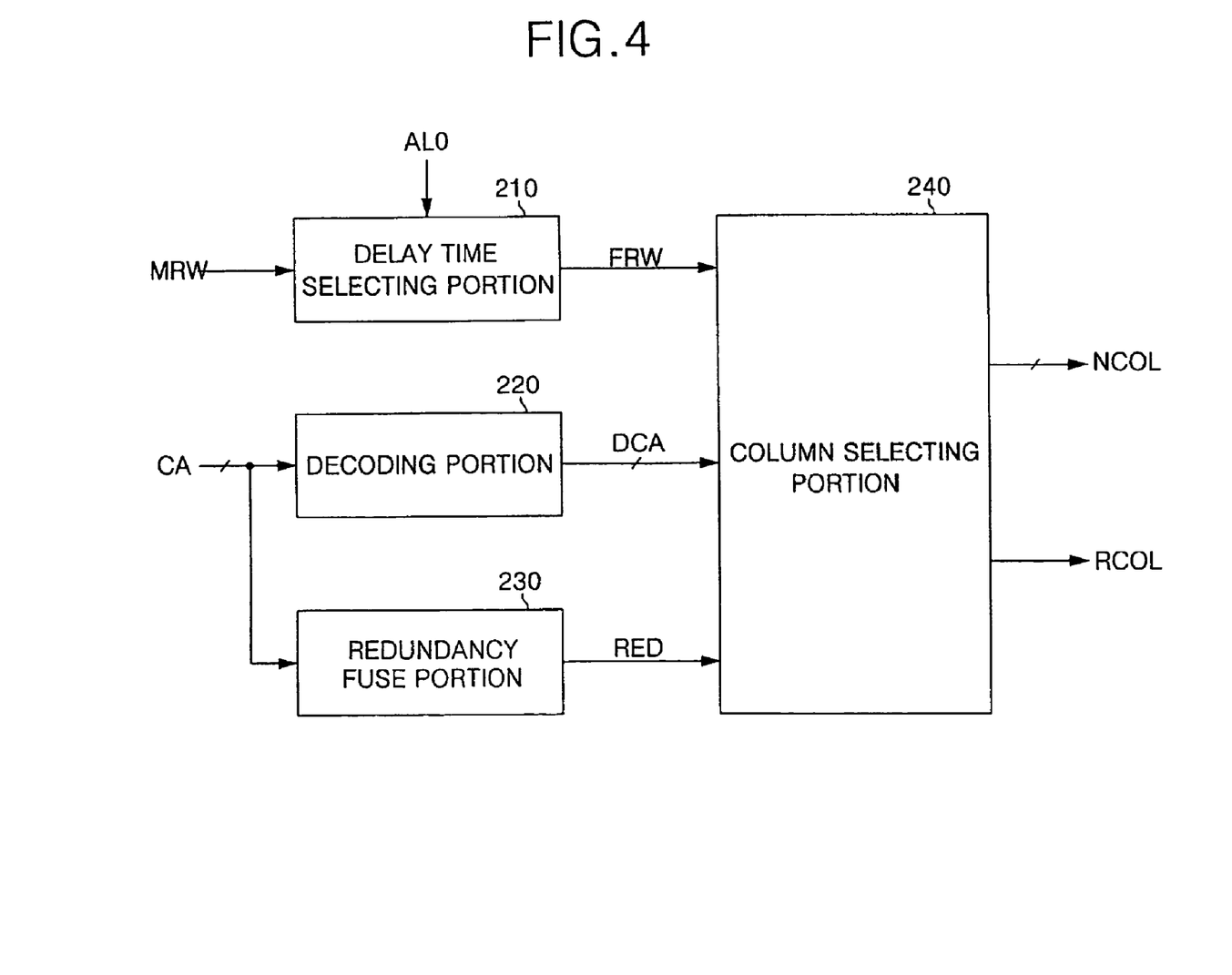
FIG. 4 is a block diagram illustrating another exemplary embodiment of an address decoder of a semiconductor memory device according to an aspect of the present invention.

FIG. 4 is a block diagram illustrating another exemplary embodiment of an address decoder of a semiconductor memory device according to an aspect of the present invention. The address decoder of FIG. 4 determines whether or not the redundancy memory cell is to be used in response to the column address CA, and further decodes the column address CA to output the decoded column address DCA.

A delay time selecting portion 210 delays the internal read/write command MRW during a predetermined time to output the final read/write command FRW when the additive latency AL=0 is at a high level, and does not delay the internal read/write command MRW to output the final read/write command FRW when the additive latency AL=0 is at a low level.

A decoding portion 220 decodes an externally applied address to output the decoded address. As in FIG. 2, the decoding portion 220 receives the column addresses CA0 and CA1 among the addresses to output the decoded column addresses DCA0 to DCA3. If the additive latency AL=0 is at a high level, the column address CA is applied after the internal read/write command MRW is applied, and if the additive latency AL=0 is at a low level, the column address CA is applied before the internal read/write command MRW is applied.

A redundancy fuse circuit portion 230 outputs the redundancy selecting signal RED representing whether to use the redundancy memory cell according to a state of a fuse, which is blown out or not, when the column address CA is applied. Like the decoding portion 220, the redundancy fuse circuit portion 230 receives the column address CA after the internal read/write command MRW is applied when the additive latency AL=0 is at a high level and receives the column address CA before the internal read/write command MRW is applied when the additive latency AL=0 is at a low level.

Thus, the decoding portion 220 and the redundancy fuse circuit portion 230 decode the column address CA applied before the internal read/write command MRW to determine whether to use the redundancy memory cell if the additive latency AL is not AL=0.

A column selecting portion 240 outputs the column selecting signal NCOL or the redundancy selecting signal RCOL for selecting a corresponding column of the memory cell array in response to the final read/write command FRW, the decoded column address DCA, and the redundancy selecting signal RED.

Accordingly, the address decoder of FIG. 4 decodes the column address CA applied before the internal read/write command MRW to determine whether to use the redundancy memory cell when the additive latency AL is not "AL=0", thereby outputting the column selecting signal NCOL or the redundancy selecting signal RCOL faster when the additive latency AL is "AL=0".

Figure 5:
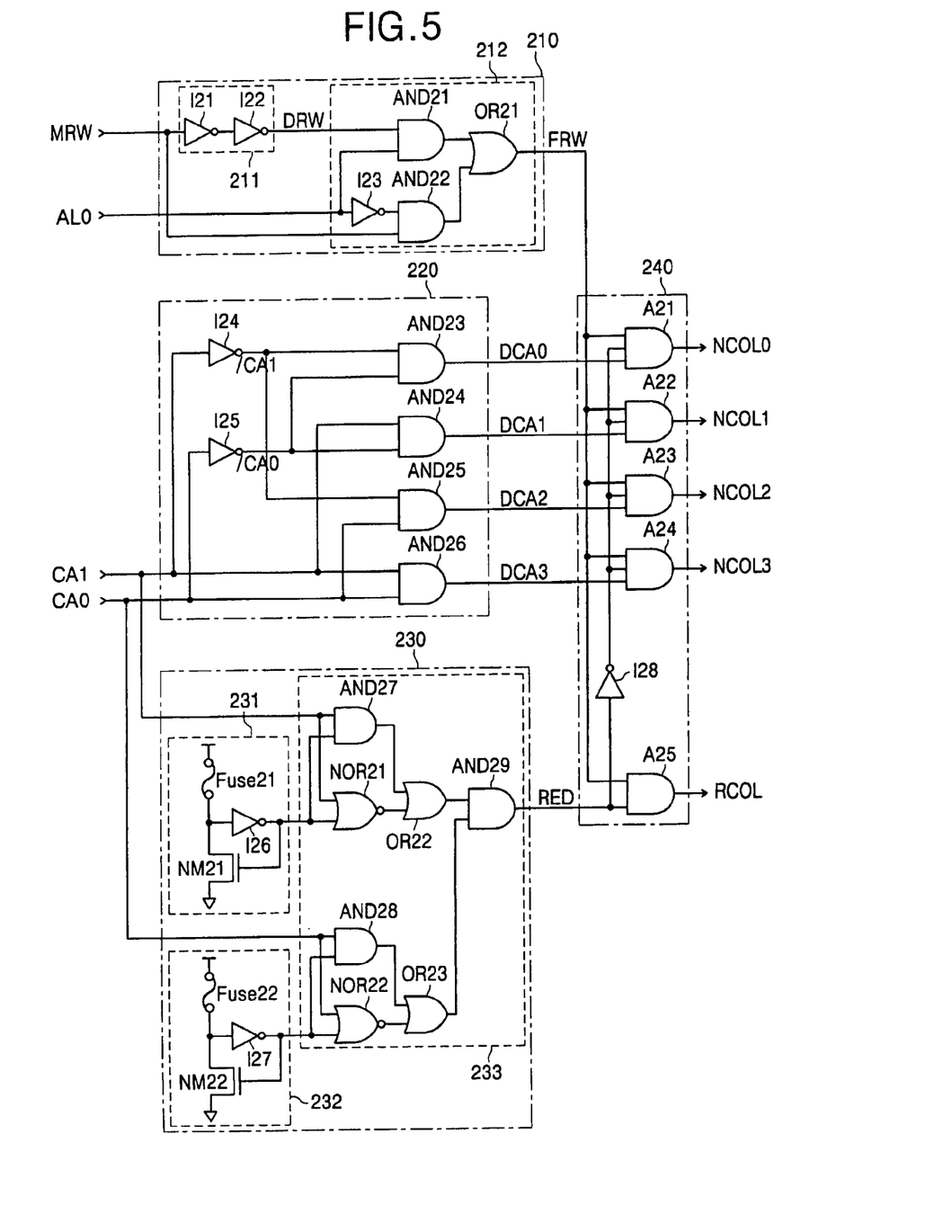
FIG. 5 is a circuit diagram illustrating an embodiment of the address decoder of FIG. 4.

FIG. 5 is a circuit diagram illustrating an embodiment of the address decoder of FIG. 4. The address decoder of FIG. 5 comprises a delay time selecting portion 210, a delay portion 211, and a selecting circuit portion 212. The delay portion 211 comprises even-number inverters I21 and I22 and delays the internal read/write command MRW during a predetermined time to output the delayed read/write command DRW. The selecting circuit portion 212 outputs the final read/write command FRW in response to the internal read/write command MRW, the delayed read/write command DRW, and the additive latency AL=0. The selecting circuit portion 212 comprises two AND gates AND21 and AND22, an OR gate OR21, and an inverter I23. The AND gate AND21 ANDs the delayed read/write command DRW and the additive latency AL=0, and the AND gate AND22 ANDs the additive latency AL=0 inverted by the inverter I23 and the internal read/write command MRW. The OR gate OR21 ORs the outputs of the two AND gates AND21 and AND22 to output the final read/write command FRW. Thus, the selecting circuit portion 212 outputs the final read/write command FRW in response to the delayed read/write command DRW if the additive latency AL=0 is at a high level and outputs the final read/write command FRW in response to the internal read/write command MRW if the additive latency AL=0 is at a low level. Thus, the delay time selecting portion 210 outputs the final read/write command FRW when the additive latency AL is not "AL=0" faster than when the additive latency AL is "AL=0".

The decoding portion 220 is a decoder which receives the column address CA to select a corresponding column of the memory cell array, and is a circuit which receives and decodes the 2-bit column address CA0 and CA1. The decoding portion 220 comprises four AND gates AND23 to AND26 and two inverters I24 and I25. The two inverters I24 and I25 invert the column addresses CA0 and CA1, and the AND gates AND23 to AND26 receive and AND the column addresses CA0 and CA1 and the inverted column addresses /CA0 and /CA1, respectively, to output four decoded column addresses DCA0 to DCA3.

The redundancy fuse circuit portion 230 comprises two fuse circuit portions 231 and 232 and a determining circuit portion 233. Since a 2-bit column address CA0 and CA1 is applied in FIG. 5, the fuse circuit portions 231 and 232 are arranged for the column addresses CA0 and CA1, respectively. The fuse circuit portion 231 comprises a fuse Fuse21 for determining whether to use the redundancy memory cell and an inverter I26 and an NMOS transistor NM21 which constitute a latch, and the fuse circuit portion 232 comprises a fuse Fuse22 for determining whether to use the redundancy memory cell and an inverter I27 and an NMOS transistor NM22 which constitute a latch. The fuses Fuse21 and Fuse22 are blown out by the repairing task, which is performed depending on the existence of the defective memory cell after a test of the semiconductor memory device. In a state that the fuses Fuse21 and Fuse22 are blown out, the redundancy column is used. The fuses Fuse21 and Fuse22 of the fuse circuit portions 231 and 232 are selectively blown out to replace a certain column of the memory cell array with the redundancy column. In the state that the fuses Fuse21 and Fuse22 are blown out, the fuse circuit portions 231 and 232 output a value having a high level by the latch comprised of the inverters I26 and I27 and the NMOS transistors NM21 and NM22, respectively.

The determining circuit portion 233 outputs the redundancy selecting signal RED in response to signals outputted from the fuse circuit portions 231 and 232 and the column address CA0 and CA1. The AND gates AND27 and AND28 and the NOR gates NOR21 and NOR22 of the determining circuit portion 233 receive the column addresses CA0 and CA1 and the outputs of the fuse circuit portions 231 and 232, respectively. And the OR gates OR22 and OR23 OR the outputs of the AND gates AND27 and AND28 and the NOR gates NOR21 and NOR22 and output the ORing result, respectively. The AND gate. AND29 ANDs of the outputs of the NOR21 and NOR22 to output the redundancy selecting signal RED.

The determining circuit portion 233 outputs the redundancy selecting signal RED having a high level when the column addresses CA0 and CA1 have a high level and the fuses Fuse21 and Fuse22 are blown out, and outputs the redundancy selecting signal RED having a high level when the column addresses CA0 and CA1 have a low level and the fuses Fuse21 and Fuse22 are not blown out. The determining circuit portion 233 outputs the redundancy selecting signal RED having a high level when the column address CA0 having a low level and the column address CA1 having a high level are applied in case where the fuse Fuse21 is blown out and the fuse Fuse22 is not blown out. The determining circuit portion 233 outputs the redundancy selecting signal RED having a high level when the column address CA0 having a high level and the column address CA1 having a low level are applied in case where the fuse Fuse21 is not blown out and the fuse Fuse22 is blown out.

The column selecting portion 240 outputs the corresponding column signals NCOL0 to NCOL3 or the redundancy column selecting signal RCOL in response to the final read/write command FRW, the decoded column addresses DCA0 to DCA3, and the redundancy selecting signal RED. An inverter I28 of the column selecting portion 240 inverts the redundancy selecting signal RED, and the AND gates A21 to A24 AND the decoded column addresses DCA0 to DCA3, the final read/write command FRW, and the inverted redundancy selecting signal RED to output the column selecting signals NCOL0 to NCOL3, respectively. An AND gate A25 outputs the redundancy column selecting signal RCOL in response to the redundancy selecting signal RED and the final read/write command FRW.

That is, the column selecting portion 240 outputs the column selecting signals NCOL0 to NCOL3 having a low level when the redundancy selecting signal having a high level is applied, and outputs the column selecting signal RCOL having a high level to thereby activate the redundancy column.

As shown in FIG. 5, the address decoder replaces the column selecting signals NCOL0 to NCOL3 for the certain column addresses CA0 and CA1 with the redundancy column selecting signal RCOL according to the state of the fuses Fuse21 and Fuse22 of the fuse circuit portions 231 and 232 which are selectively blown out.

Accordingly, the address decoder rapidly outputs the final read/write command FRW since it does not delay the internal read/write command MRW if the additive latency AL is not "AL=0", and outputs the column selecting signals NCOL0 to NCOL3 or the redundancy column selecting signal RCOL in response to the rapidly outputted final read/write command, whereby the speed accessing the certain column of the memory cell becomes fast.

Figure 6A:
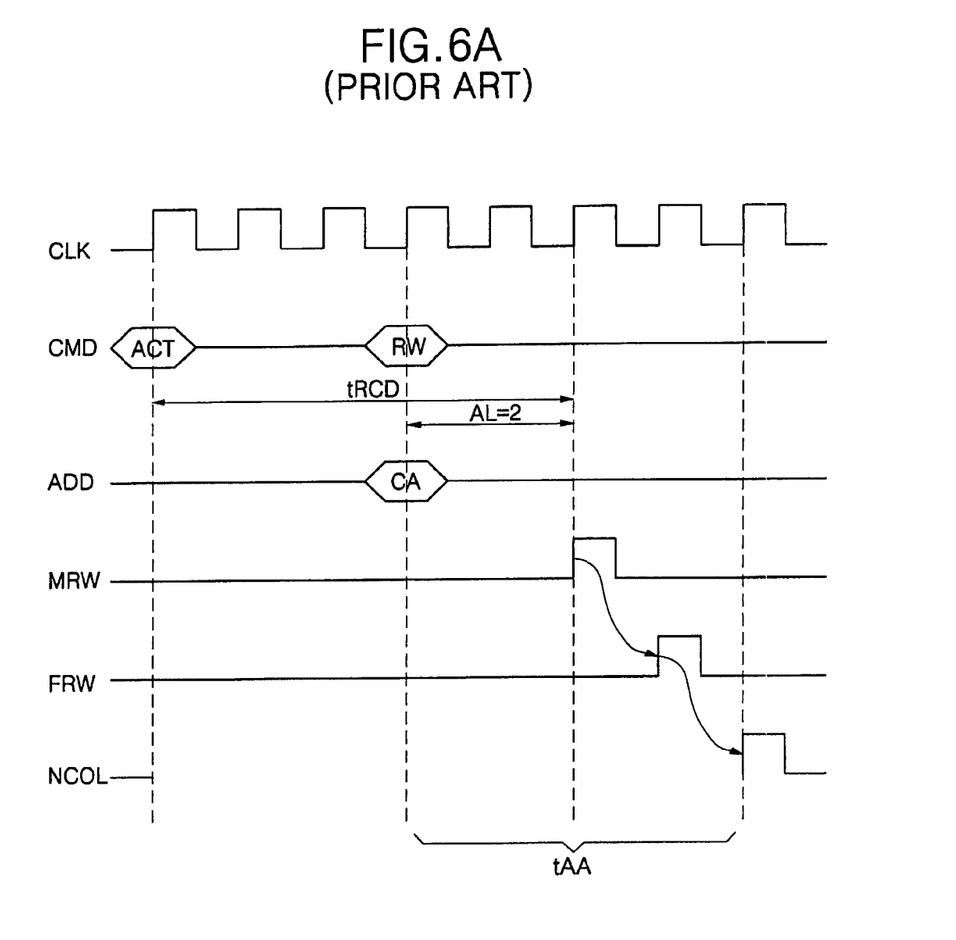
FIG. 6A is an address access timing diagram of a prior semiconductor memory device.
Figure 6B:
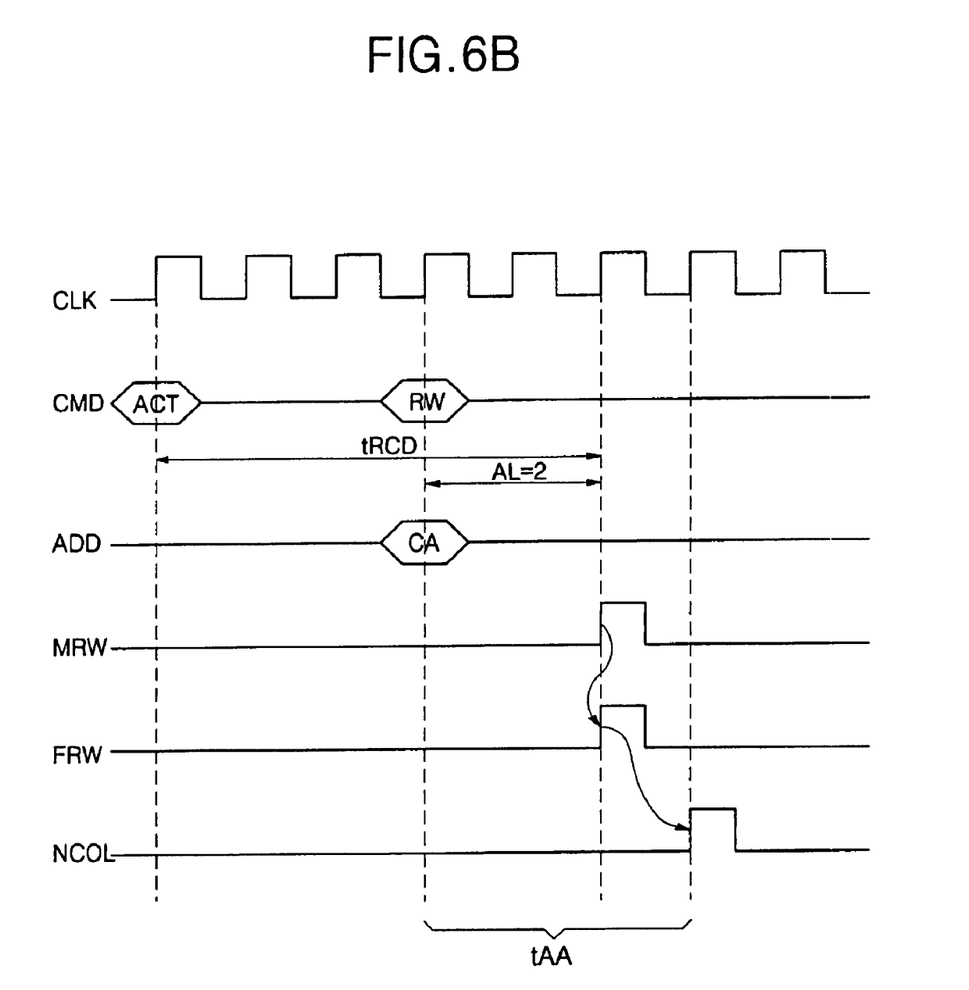
FIG. 6B is an address access timing diagram of a semiconductor memory device according to the present invention.

FIG. 6A is an address access timing diagram of a conventional semiconductor memory device (e.g., as in FIG. 1), and FIG. 6B is an address access timing diagram of a semiconductor memory device according to the present invention (e.g., as in FIGS. 2 and 4). In FIGS. 6A and 6B, the additive latency AL is set to 2 (i.e., where "AL=2").

In FIG. 6A, since the tRCD is 5 clock cycles and the additive latency AL is set "AL=2", the external read/write command RW is applied when three clock cycles lapse after the active command ACT is applied. When the read/write command is applied from the external portion, the column address CA is also applied from the external portion. The internal read/write command MRW is generated when the two clock cycles lapse after the external read/write command RW is applied. When the internal read/write command MRW is generated, the redundancy fuse and decoder 20 decodes the column address CA and determines whether to use the redundancy memory cell to output the decoded address and the redundancy selecting signal, and during that time, the internal read/write command MRW is delayed by the delay portion 10 to be outputted as the final read/write command FRW. The column selecting portion 30 outputs the column selecting signal NCOL or the redundancy column selecting signal RCOL in response to the final read/write command FRW, the decoded address DCA, and the redundancy selecting signal RED.

In FIG. 6B, since the tRCD is 5 clock cycles and the additive latency AL is set "AL=2", the external read/write command RW is applied when three clock cycles lapse after the active command ACT is applied. When the read/write command is applied from the external portion, the column address CA is also applied from the external portion. The internal read/write command MRW is generated when the two clock cycles lapse after the external read/write command RW is applied. Before the internal read/write command MRW is generated, the decoding portions 120 and 220 and the redundancy fuse and decoder 230 decode the column address CA and determines whether to use the redundancy memory cell to output the decoded address and the redundancy selecting signal. Since the additive latency AL is not "AL=0", the internal read/write command MRW is not delayed and directly outputted as the final read/write command FRW. The column selecting portions 130 and 240 output the column selecting signal NCOL or the redundancy column selecting signal RCOL in response to the final read/write command FRW, the decoded address DCA and the redundancy selecting signal RED.

Compared to FIG. 6A, it can be seen in FIG. 6B that the internal read/write command MRW is not delayed and directly outputted as the final read/write command FRW, whereby the asynchronous access time tAA is short.

Figure 7:
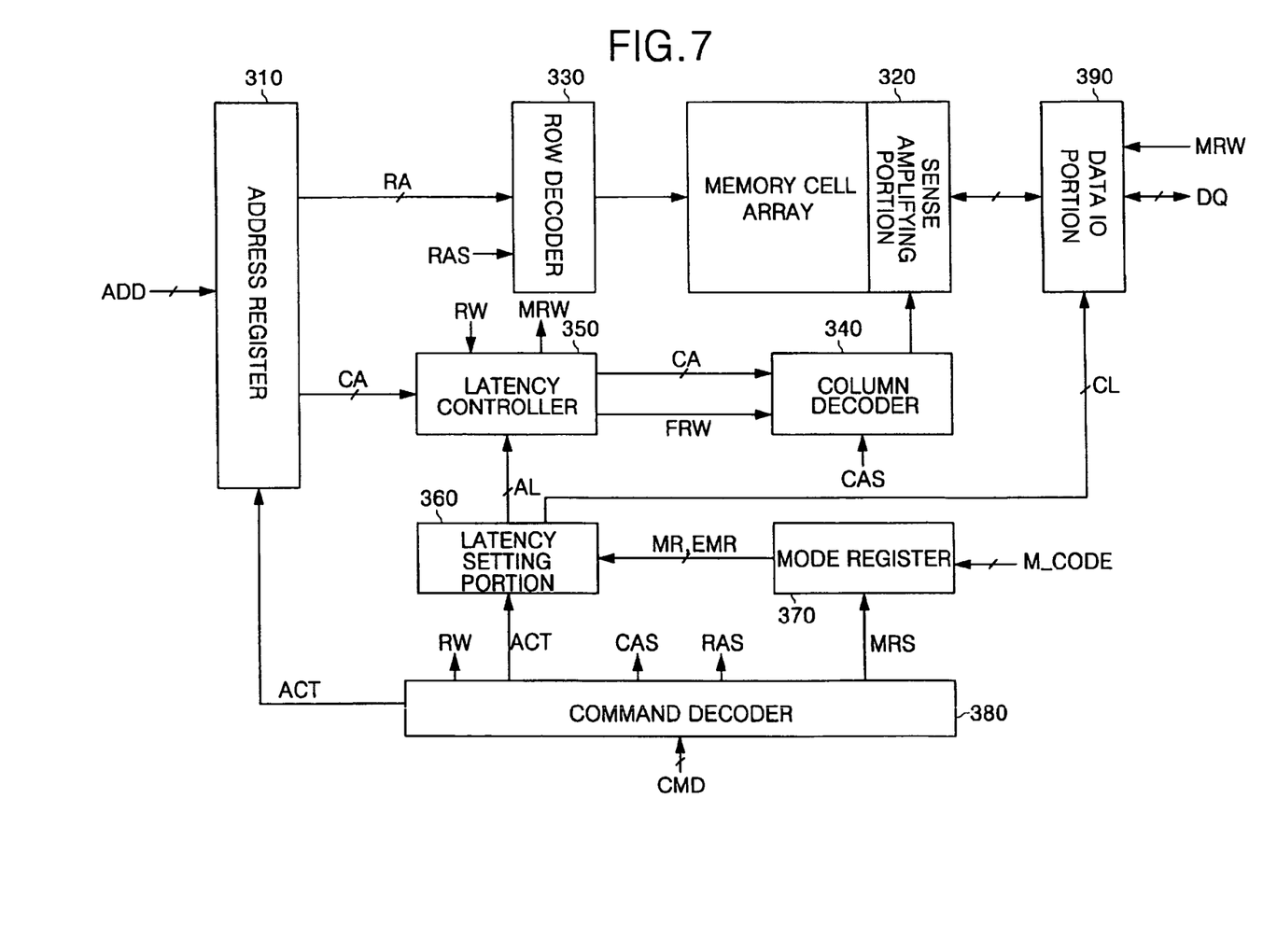
FIG. 7 is a block diagram illustrating an embodiment of a semiconductor memory device according to an aspect of the present invention.

FIG. 7 is a block diagram illustrating an embodiment of a semiconductor memory device according to an aspect of the present invention. An address register 310 receives the addresses ADD in response to the active signal ACT applied from a command decoder 380 during an active operation, classifies them into the row address RW and the column address CA and transmits them to a row decoder 330 and a column decoder 340, respectively.

The row decoder 330 receives the row address RA from the address register 310 to designate a certain row of a memory cell array 320 in response to the row address strobe signal RAS applied from the command decoder 380.

The column decoder 340 receives and decodes the column address CA from a latency controller 350 to designate a certain column of the memory cell array 320 in response to the column address strobe signal CAS applied from the command decoder 380.

The column decoder 340 comprises the decoding portion 120 or 220, the redundancy fuse portion 230, and the column selecting portion 130 or 240 of FIGS. 2 to 5, and receives and decodes the column address CA before the internal read/write command MRW is generated in the latency controller 350 to determine whether to use the redundancy memory cell if the additive latency AL is not "AL=0".

The memory cell array 320 comprises a plurality of word lines arranged in a transverse direction, a plurality of bit lines arranged in a vertical direction, memory cells arranged at crossing points of the word lines and the bit lines, and a sense amplifying portion having a plurality of sense amplifiers which detect and amplifies data. Memory cells on the word line which is selected by the row decoder 330 in the memory cell array 320 are activated, and the sense amplifier selected by the column decoder 340 detects and amplifies data DQ of a corresponding memory cell among the activated memory cells on the word line.

A data IO portion 390 inputs/outputs data to/from the memory cell designated by the row decoder 330 and the column decoder 340 in response to the internal read/write command MRW outputted from the latency controller 350. The data IO portion 390 receives the CAS latency CL from a latency setting portion 360 and outputs data to the external portion at a time designated by the CAS latency CL during the data read operation.

The command decoder 380 analyzes a command CMD applied from the external portion, and outputs a mode setting signal MRS to a mode register 370 and outputs the read/write command RW for controlling the data input and output to the latency controller 350.

The mode register 370 receives the mode register setting signal MRS from the command decoder 380 and a mode setting code M_CODE from the external portion in response to the mode setting signal MRS, combines them and stores a basic setting of the semiconductor memory device. The mode register 370 outputs the mode setting signal MR when the mode setting code M_CODE applied from the external portion is a basic mode setting code and outputs an extended mode setting signal EMR to the latency setting portion 360 when the mode setting code M_CODE applied from the external portion is an extended mode setting code other than a basic mode setting code.

The latency setting portion 360 decodes a latency setting code that is part of the extended mode setting signal EMR to output the additive latency AL in response to the extended mode setting signal EMR applied from the mode register 370. The latency setting portion 360 receives the setting for the CAS latency from the mode setting signal MR and outputs the CAS latency CL to the data IO portion 390 when the basic mode setting code is stored in the mode register 370.

The latency controller 350 receives the additive latency AL from the latency setting portion 360, and receives the column address CA from the address register 310 in response to the read/write command RW applied from the command decoder 380. The latency controller 350 delays the read/write command RW by the set additive latency AL to output the internal read/write command MRW. Here, in case where the additive latency AL is not "AL=0", the column address CA can be outputted to the column decoder 340 before the internal read/write command MRW is generated. The latency controller 350 further comprises the delay time selecting portion 110 or 210 of FIGS. 2 to 5 and delay or does not delay the internal read/write command MRW according to the additive latency AL to be outputted as the final read/write command FRW. The column decoder 340 decodes the column address CA to determine whether to use the redundancy column until the internal read/write command MRW is applied after the tRCD, so that the delay time selecting portion 110 or 210 of the latency controller 350 does not need to delay the internal read/write command MRW and directly outputs the final read/write command FRW.

That is, in FIG. 7, the column decoder 340 receives the column address CA before the internal read/write command FRW to perform the process for determining the address and thus outputs the column selecting signal or the redundancy column selecting signal when the final read/write command MRW is applied after the tRCD, thereby reducing the asynchronous access time tAA for the corresponding memory cell of the memory cell array.

In the above described exemplary embodiments, the DRAM has been described as an example of the semiconductor memory device. When the present invention is applied to the DRAM, the case where the additive latency AL is not "AL=0" has been described above, but the present invention can be applied to a case where the column address is applied before the internal read/write command in the semiconductor memory device having the typical memory. In FIGS. 2 to 5, the present invention has been exemplarily described focusing on decoding of the column address and determining whether to use the redundancy column, but the present invention can be applied to decoding of the row address and determining whether to use the redundancy row.

As described above, the semiconductor memory device of the present invention decodes the address and determines whether to use the redundancy memory cell in advance when the address is applied before the internal read/write command is generated, so that it does not need to delay the internal read/write command. The corresponding memory cell can be accessed directly when the internal read/write command is applied after the tRCD, whereby the asynchronous access time is reduced and the operation speed of the semiconductor device is significantly improved.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A semiconductor memory device, comprising:
    a delay time selecting portion configured to receive an internal read/write command and output the internal read/write command with no substantial delay as a final read/write command when an additive latency is not "0", and output a delayed read/write command generated by delaying the internal read/write command for a predetermined time as the final read/write command when an additive latency is "0" ;
    a decoder configured to decode an address applied from an external portion with the read/write command to output a decoded address; and
    a selecting portion configured to receive the decoded address to select a memory cell of a memory cell array in response to the final read/write command,
    wherein the internal read/write command is generated by delaying an external read/write command for as long as the additive latency.

2. The device of claim 1, wherein the delay time selecting portion comprises:
    a delay portion configured to delay the internal read/write command during the predetermined time to output the delayed read/write command; and
    a selecting circuit portion configured to determine whether the additive latency is "0" or not to select the internal read/write command or the delayed read/write command outputted from the delay portion to be outputted as the final read/write command.

3. The device of claim 2, wherein the delay portion comprises an even number of inverters configured to delay the internal read/write command during a time for the decoding portion decoding the address.

4. The device of claim 1, further comprising:
a redundancy fuse portion configured to output a redundancy selecting signal representing whether to use a redundancy memory cell in lieu of a normal memory cell when the address is applied, based on a state of a fuse being blown out or not.

5. The device of claim 4, wherein the redundancy fuse portion comprises:

a fuse circuit portion including the fuse; and
a determining circuit portion configured to output the redundancy selecting signal in response to whether or not the fuse is blown out and the address.

6. The device of claim 5, wherein the fuse circuit portion comprises:
the fuse configured to determine whether to use the redundancy memory cell for a corresponding address of the address; and
a latch configured to store a different value depending on a state of the fuse.

7. The device of claim 1, wherein the internal read/write command is generated when a time corresponding to tRCD lapses after an active command is inputted in the device.

* * * * *